US009104615B2

(12) United States Patent
Noguet et al.

(10) Patent No.: US 9,104,615 B2
(45) Date of Patent: Aug. 11, 2015

(54) PROCESSOR FOR PROCESSING DIGITAL DATA WITH PIPELINED BUTTERFLY OPERATOR FOR THE EXECUTION OF AN FFT/IFFT AND TELECOMMUNICATION DEVICE

(75) Inventors: Dominique Noguet, Saint Simeon de Bressieux (FR); Malek Naoues, Grenoble (FR)

(73) Assignee: Commissariat à l'énergie atomique et aux énergies alternatives, Paris (FR)

(*) Notice: Subject to any disclaimer, the term of this patent is extended or adjusted under 35 U.S.C. 154(b) by 434 days.

(21) Appl. No.: 13/702,769

(22) PCT Filed: May 31, 2011

(86) PCT No.: PCT/FR2011/051250
§ 371 (c)(1),
(2), (4) Date: Dec. 7, 2012

(87) PCT Pub. No.: WO2011/154642
PCT Pub. Date: Dec. 15, 2011

(65) Prior Publication Data
US 2013/0077663 A1  Mar. 28, 2013

(30) Foreign Application Priority Data
Jun. 7, 2010  (FR) .................................. 10 54458

(51) Int. Cl.
*G06F 15/00*  (2006.01)
*G06F 17/14*  (2006.01)
(Continued)

(52) U.S. Cl.
CPC ......... *G06F 17/142* (2013.01); *H03M 13/3905* (2013.01); *H03M 13/4107* (2013.01); *H04L 27/265* (2013.01)

(58) Field of Classification Search
CPC .............. G06F 17/142; G06F 9/30014; G06F 9/30036; G06F 17/14; G06F 17/10
USPC ......................................................... 708/409
See application file for complete search history.

(56) References Cited

U.S. PATENT DOCUMENTS

| 6,366,936 B1 * | 4/2002 | Lee et al. ...................... 708/404 |
| 2009/0106341 A1 | 4/2009 | Al Adnani |
| 2012/0281739 A1 | 11/2012 | Alaus et al. |

FOREIGN PATENT DOCUMENTS

| EP | 1 758 030 | 2/2007 |
| WO | 2011 064514 | 6/2011 |

OTHER PUBLICATIONS

Naoues, M., et al., "An Efficient Flexible Common Operator for FFT and Viterbi Algorithms," 2011 IEEE 73$^{rd}$ Vehicular Technology Conference, pp. 1-5, (May 15-18, 2011).

(Continued)

*Primary Examiner* — Tan V. Mai
(74) *Attorney, Agent, or Firm* — Oblon, McClelland, Maier & Neustadt, L.L.P.

(57) ABSTRACT

A processor for processing digital data includes at least one butterfly operator for execution of a fast Fourier transform computation, the butterfly operator having a pipeline architecture for synchronized receiving and processing of input data according to a clock signal. This pipeline architecture includes a plurality of elements including addition, subtraction, and multiplication hardware modules and links for synchronized transmission of data between the modules. At least one element of this pipeline architecture is configurable by at least one programmable parameter, between a first configuration wherein the butterfly operator performs the fast Fourier transform computation and a second configuration wherein the butterfly operator performs a metric computation of an implementation of a channel decoding algorithm.

10 Claims, 5 Drawing Sheets

Figure 1:
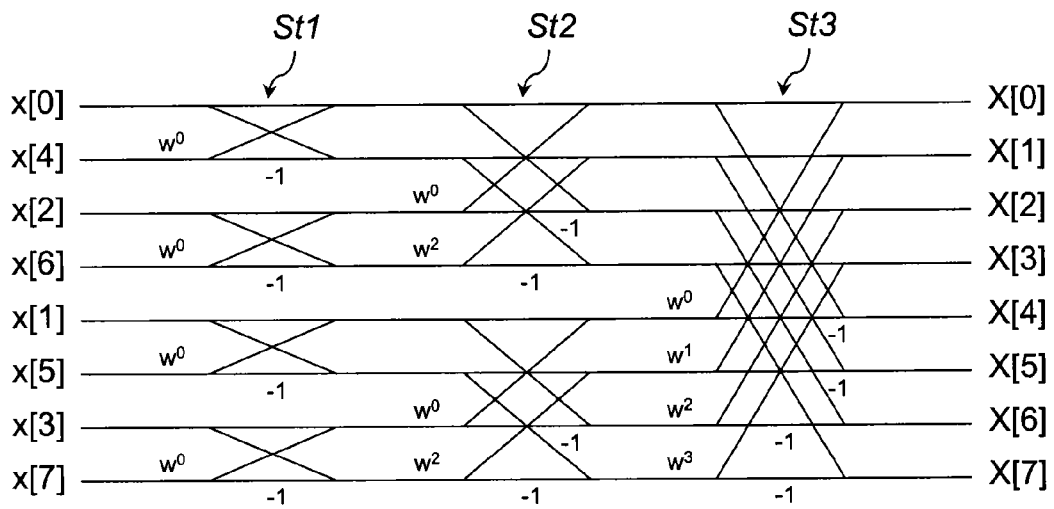

(51) Int. Cl.
*H03M 13/39* (2006.01)
*H03M 13/41* (2006.01)
*H04L 27/26* (2006.01)

(56) References Cited

OTHER PUBLICATIONS

Takala, J., et al., "Scalable FFT Processors and Pipelined Butterfly Units," Journal of VLSI Signal Processing, vol. 43, pp. 113-123, (Jun. 2006).

Lee, H., et al., "A Low-Power DSP for Wireless Communications," IEEE Transactions on Very Large Scale Integration Systems, vol. 18, No. 9, pp. 1310-1322, (Sep. 2010).

"Index of /~chaitali/jourpapers," Chaitali Chakrabarti, www.public.asu.edu/~chaitali/jourpapers/, Total 2 Pages, (Apr. 29, 2011).

Jung, C.Y., et al., "Design of Reconfigurable Coprocessor for Communication Systems," IEEE Workshop on Signal Processing Systems 2004, pp. 142-147, (Oct. 13-15, 2004).

Lange, H., et al., "Reconfigurable Multiply-Accumulate-based Processing Element," Proceedings of the 2002 IEEE Workshop on Heterogeneous Reconfugurable Systems on Chip, pp. 1-4, (Apr. 25, 2002).

Huang, Y.H., et al., "A 1.1 MAC/s Sub-Word-Parallel Digital Signal Processor for Wireless Communication Applications," IEEE Journal of Solid-State Circuits, vol. 39, No. 1, (Jan. 2004).

Hangpei, T., et al., "Gaining Flexibility and Performance of Computing Using Tailored Instruction Set and Reconfigurable Architecture," 2008 International Conference on Multimedia and Ubiquitous Engineering, pp. 324-329, (Apr. 24, 2008).

Alaus, L., et al., "Promising Technique of Parameterization for Reconfigurable Radio, the Common Operators Technique: Fundamentals and Examples," Journal of Signal Processing Systems, Total 13 Pages, (Mar. 14, 2009).

Naoues, M., et al., "A common Operator for FFT and Viterbi algorithms," 2010 13th Euromicro Conference on Digital System Design, Architectures, Methods and Tools, pp. 309-313, (Sep. 1, 2010).

Alaus, L., "Architecture Reconfigurable pour un Equipement Radio Multistandard," Thèse de Doctorat, Université de Rennes 1, Total 262 Pages, (Nov. 25, 2010).

International Search Report Issued Oct. 30, 2012 in PCT/FR11/51250 Filed May 31, 2011.

\* cited by examiner

PROCESSOR FOR PROCESSING DIGITAL DATA WITH PIPELINED BUTTERFLY OPERATOR FOR THE EXECUTION OF AN FFT/IFFT AND TELECOMMUNICATION DEVICE

This invention relates to a processor for processing digital data for the execution of a fast Fourier transform, called FFT, or inverse fast Fourier transform, called IFFT. It also relates to a transceiver telecommunication device comprising at least one such processor.

Such a processor is useful in a large number of telecommunication applications, in particular in devices with multicarrier modulation/demodulation of the signals transmitted/received. Indeed, in this type of device, the modulation/demodulation generally and advantageously involves a digital FFT/IFFT computation, in particular in a software radio or reconfigurable software-defined radio (SDR) context.

An SDR-type transmission/reception device is a device wherein the digital/analogue conversion is performed as close as possible to the antenna, so that the modulation/demodulation and coding/decoding processing operations executed by the telecommunication device occur on digital signals. These digital signals are indeed better suited for a reconfigurable processing, i.e. capable of being adapted to different standards or different changes.

Today, for example, numerous wireless communication standards exist. An immediate consequence of this proliferation of standards is the increasing need for devices capable of managing different standards. The limitations in computing capacity and excessive power consumption of the programmable processors for signal processing make these devices an unsuitable solution for adequately responding to this need. Consequently, a pure software solution cannot be envisaged, and hardware operators must be used.

A first solution for managing a plurality of standards consists of juxtaposing, within the same telecommunication device, the different processing chains of the standards considered, each comprising their hardware operators. This solution is simple to implement but has the major disadvantage of not being effective in terms of silicon surface used. In addition, its upgradeability is limited to the standards initially considered and the complexity of its implementation is not optimal. Indeed, the complexity of this solution corresponds to the sum of the complexities of each standard to which that of the reconfiguration components is added.

Another solution consists of designing the different processing chains so that they share a portion of their functional modules and hardware operators. This second solution involves a parameterization of the device so that its reconfiguration so that it executes such or such a processing chain requires only a change in parameter values. In particular, a technique for sharing hardware operators is presented in the article of L. Alaus et al, entitled "Promising technique of parameterization for reconfigurable radio, the Common Operators Technique: fundamentals and examples", published in the Journal of Signal Processing Systems, DOI 10.1007/s11265-009-0353-04, on 14 Mar. 2009. According to this solution, the common operators are reconfigurable by a simple loading of parameters, they make it possible to obtain a reconfigurable device while limiting the number of hardware elements to be implemented.

As an example, this article indicates that an FFT/IFFT computation hardware operator may advantageously be shared because it is required by a large number of standards. Indeed, most telecommunication standards that exist or that are in preparation are based on OFDM (Orthogonal Frequency Division Multiplexing) modulations. The OFDM modulation is a method for coding digital signals by distribution in orthogonal frequencies. The principle of OFDM modulation consists of multiplexing a communication by distributing it over sub-channels sent simultaneously over independent frequencies. The actual core of an OFDM modulation comprises an FFT computation.

The FFT operator is more generally involved as a basic operator of signal receiving functions in the frequency domain in most standards. For example, an FFT operator is used in a frequency implementation of a channel estimation by equalization, in a multicarrier modulation/demodulation, in a despreading algorithm and in the execution of a so-called "channelling" (i.e. channel selection) function in a filter bank. This operator can therefore be used at different levels of a processing chain and in the context of different standards. It makes it possible to envisage obtaining a reconfigurable telecommunication device having a limited number of FFT computation hardware operators.

The invention more specifically relates to a processor with at least one butterfly operator, satisfying this FFT operator function by a so-called Radix-2 subdivision Cooley-Tukey algorithmic approach. Such a processor is, for example, described in the article of J. Takala et al, entitled "Scalable FFT Processors and Pipelined Butterfly Units", published in the Journal of VLSI Signal Processing, vol. 43, pages 113-123, Springer in 2006. According to an advantageous embodiment presented in this article, the butterfly operator of the processor has a pipeline architecture for synchronized receiving and processing of input data according to a clock signal, this pipeline architecture comprising a plurality of addition, subtraction and multiplication hardware modules and links for synchronized data transmission between these modules. A major advantage of this pipeline architecture is that it very substantially limits the number of hardware modules necessary in the butterfly operator, namely, for example, two multiplication modules, four addition and/or subtraction modules and two multiplexers instead of generally four multiplication modules and six addition and/or subtraction modules or three multiplication modules and nine addition and/or subtraction modules in equivalent architectures without a pipeline. This results in a very significant reduction in the surface occupied by the butterfly operator and a largely reduced consumption, ultimately for a limited loss of operating speed.

The hardware modules used, even if their number is reduced, nevertheless remain suitable for the aforementioned implementation of the FFT operator. In particular, since the FFT operator is not used in channel coding/decoding, which is, aside from modulation/demodulation, another essential function of the telecommunication transmission/reception terminals, other hardware modules must be added in order to perform the channel coding.

However, most of the standards require a channel coding method to ensure reliability of the data transmitted. Indeed, the channel coding serves to fight perturbations brought by the transmission channel by replacing the message to be transmitted with a less vulnerable message, for example by coding this message with a convolutional encoder. The Viterbi algorithm, a "Turbo decoder" algorithm, or the BCJR algorithm (named after its inventors Bahl, Cocke, Jelinek and Raviv) are thus techniques generally used to decode signals processed by a convolutional code.

The implementation of one of these techniques in an SDR-type transmission/reception device substantially increases its complexity because it requires specific hardware modules and a specific processor.

It may thus be desired to provide a processor for data processing that enables at least some of the problems and constraints mentioned above to be solved and/or the reconfigurability of a telecommunication device to be improved.

The invention therefore relates to a processor for processing digital data comprising at least one butterfly operator for the execution of a fast Fourier transform computation, this butterfly operator having a pipeline architecture for the synchronized receiving and processing of input data according to a clock signal, this pipeline architecture comprising a plurality of elements including addition, subtraction and multiplication modules and links for synchronized transmission of data between these modules, wherein at least one element of this pipeline architecture can be configured by means of at least one programmable parameter, between a first configuration wherein the butterfly operator performs said fast Fourier transform computation and a second configuration wherein the butterfly operator performs a metric computation of an implementation of a channel decoding algorithm.

The original idea used by the invention is based on the observation that the implementation by butterfly operator(s) of the FFT computation is similar to a possible implementation of the computation of branch metric values and the computation of path metric and survivor values of a channel decoding algorithm. This butterfly scheme implementation of a channel decoding algorithm shows a possible sharing of a plurality of addition and subtraction hardware modules used in an FFT computation processor with butterfly operators and in particular in a processor advantageously having a pipeline architecture. Thus, by astutely parameterizing at least one element of this architecture, it becomes possible to envisage designing a single processor for processing digital data capable, according to its parameterization, of performing an FFT computation with butterfly operators and a computation of a branch metric value and/or a path metric and survivor value of an implementation of a channel decoding algorithm. The channel decoding and modulation/demodulation functions can thus be satisfied in the same telecommunication device on the basis of common hardware operators, limiting both the number and the size of the hardware elements to be integrated in the device.

In addition, since the FFT computation performs on complex data, the processor obtained, capable of being configured between an FFT computation and a metric computation of an implementation of a channel decoding algorithm, is capable of processing input data that is either hard (binary) or soft (coded on a plurality of bits) in order to execute the channel decoding algorithm.

Optionally, the configurable element is configurable by means of the programmable parameter between the first configuration wherein the butterfly operation performs the fast Fourier transform computation, a second configuration wherein the butterfly operator performs a computation of a branch metric value of an implementation of a channel decoding algorithm, and a third configuration wherein the butterfly operator performs a computation of path metric and survivor values of an implementation of a channel decoding algorithm.

Also optionally, the configurable element comprises a link including a multiplexer assembly with a plurality of inputs and an output and with selection of one of the inputs by means of at least the programmable parameter.

Also optionally, the multiplexer assembly with a plurality of inputs and one output comprises two multiplexers with two inputs and one output, the output of one of the two multiplexers, called the upstream multiplexer, being linked to one of the inputs of the other of the multiplexers, called the downstream multiplexer, in order to provide a multiplexer assembly with three inputs and one output, and wherein the downstream multiplexer has the selection of one of its two inputs by means of the programmable parameter.

Also optionally, the butterfly operator comprises a first multiplication stage comprising two real multiplication hardware modules, a second addition and subtraction stage comprising an addition hardware module and a subtraction hardware module, the first and second stages forming a complex multiplication module with a pipeline architecture, and a third stage comprising two addition/subtraction hardware modules receiving the outputs of the hardware modules of the second stage.

Also optionally, the two addition/subtraction hardware modules are configurable by means of the programmable parameter between the first configuration wherein they switch from adder to subtractor and the reverse with each clock cycle, and the second configuration wherein they operate only as a subtractor.

Also optionally, a processor for processing digital data according to the invention comprises a plurality of butterfly operators configurable between said first configuration and said second configuration, these butterfly operators being structured with one another for a fast Fourier transform computation by a trellis-type Radix-2 Cooley-Tukey algorithmic approach and for an implementation of a trellis channel decoding algorithm with four reference symbols.

The invention also relates to a telecommunication device with multicarrier modulation/demodulation of transmitted/received signals and decoding of signals processed by a convolutional code, comprising at least one processor for processing digital data as defined above.

Optionally, a telecommunication device according to the invention uses OFDM modulation and demodulation.

Optionally, a telecommunication device according to the invention is of the multi-standard type, comprising at least one modulator/demodulator with OFDM modulation and demodulation compatible with each standard implemented and at least one decoder of a signal encoded by a convolutional code compatible with each standard implemented.

Figure 2:
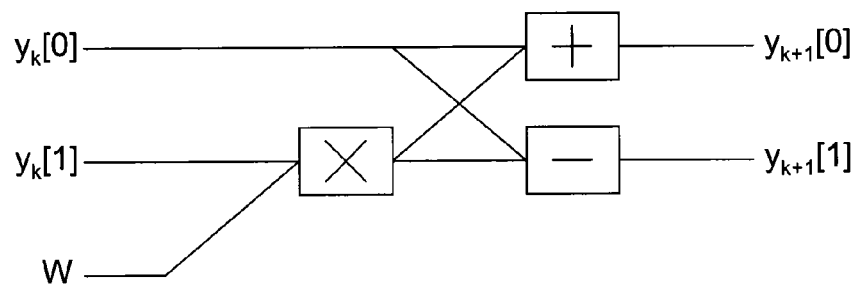
Figure 3:
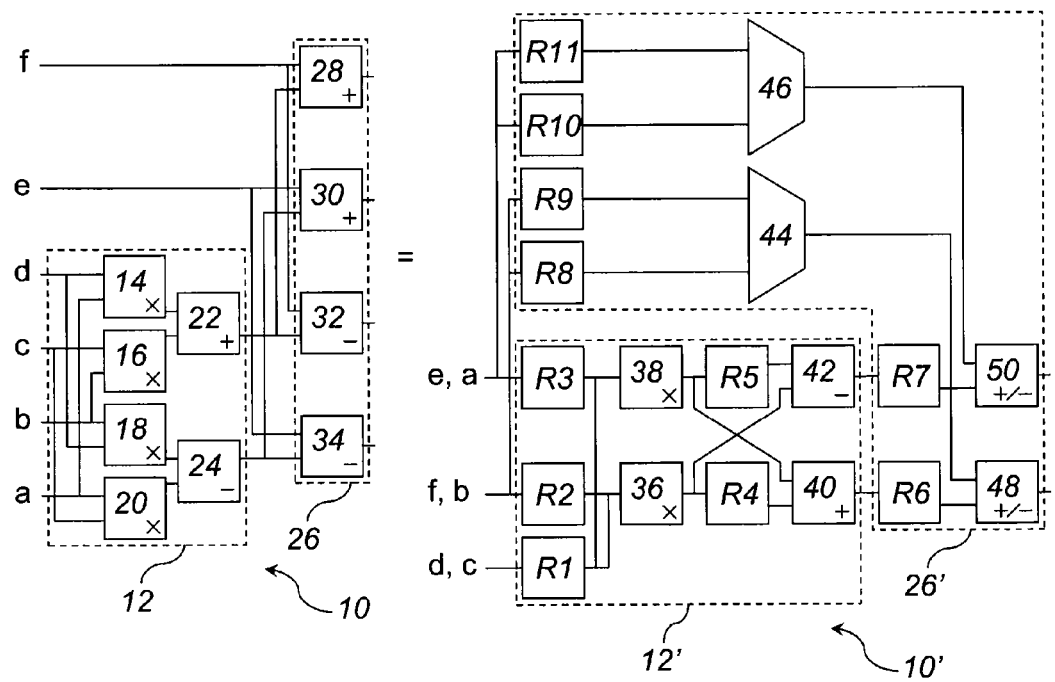
Figure 4:
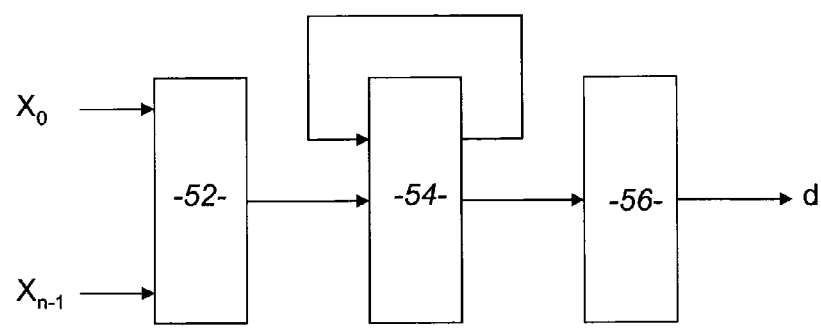
Figure 5:
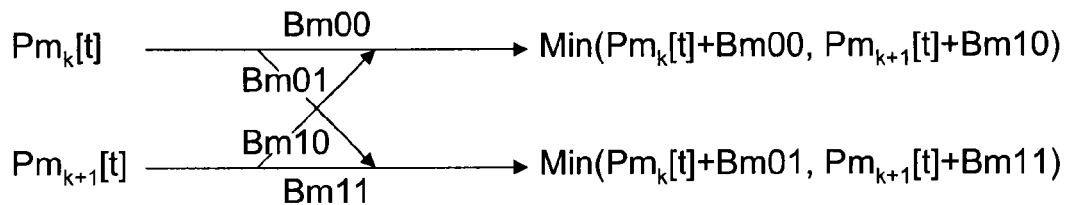
Figure 6A:
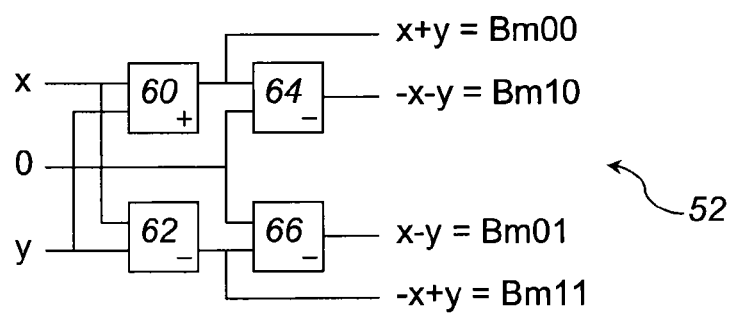
Figure 6B:
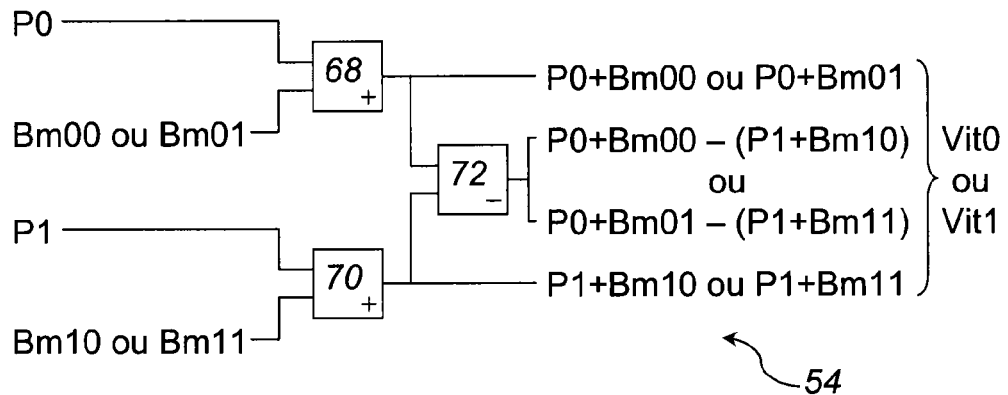
Figure 7:
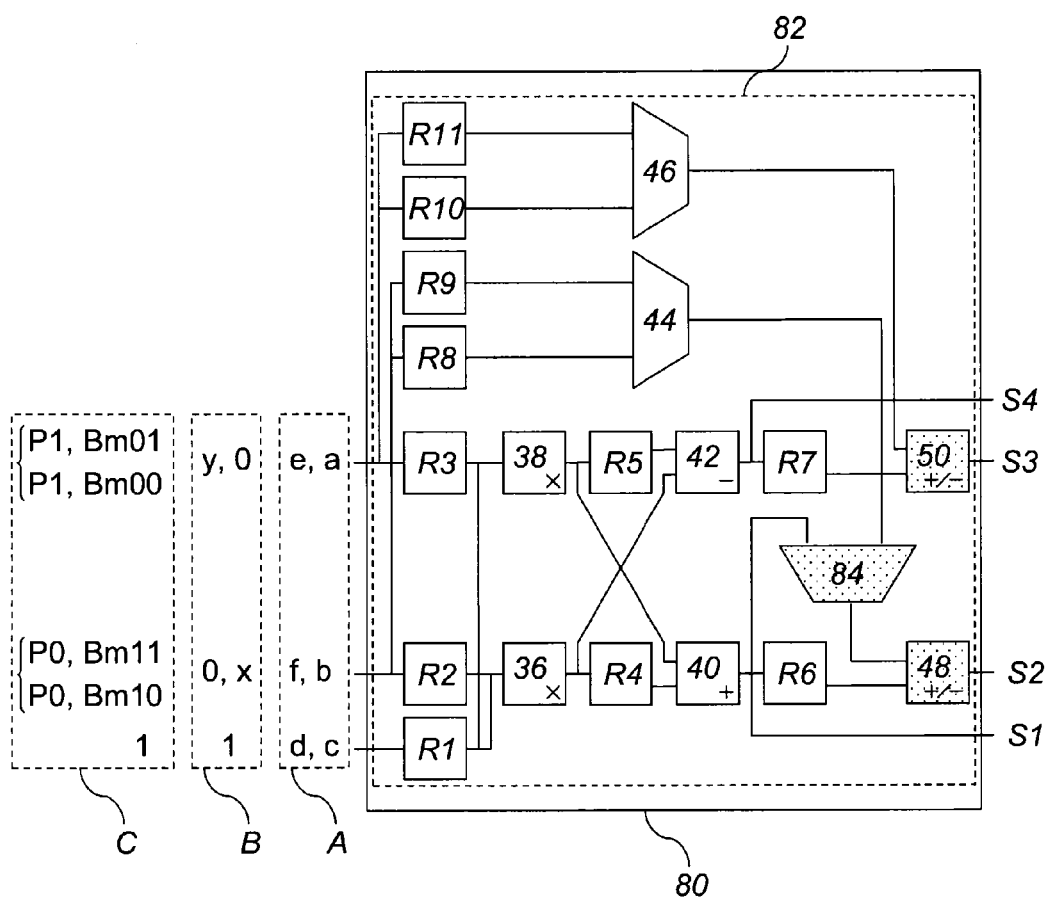
Figure 8:
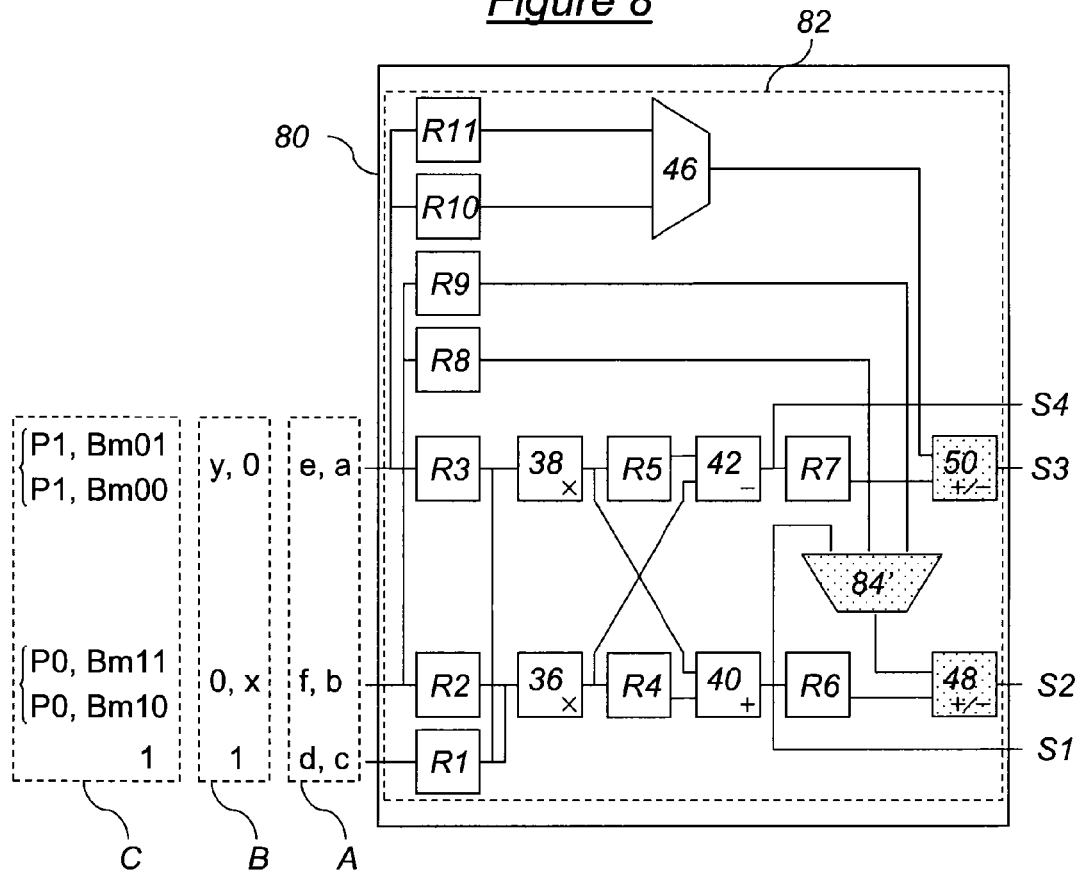
Figure 9:
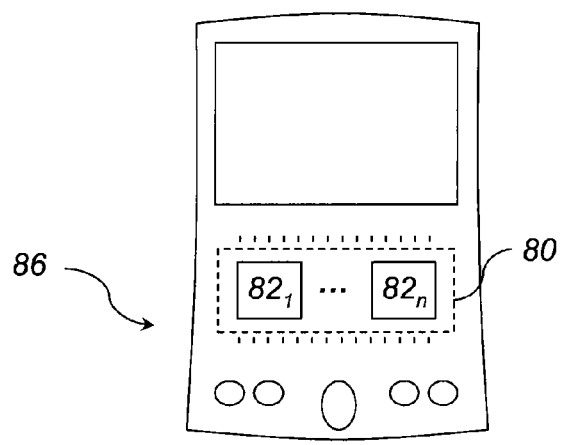

The invention will be better understood with the aid of the following description, provided solely for the purpose of providing an example, and in reference to the appended drawings, as follows:

FIG. 1 schematically shows the structure, with eight bit-reversed inputs and eight in-order outputs, of a trellis data processing network for the implementation of an FFT/IFFT computation by a Radix-2 subdivision Cooley-Tukey algorithmic approach, FIG. 2 schematically shows the structure of a butterfly operator used by the data processing network of FIG. 1, FIG. 3 schematically shows a possible implementation in addition/subtraction and multiplication modules of the butterfly operator of FIG. 2, FIG. 4 schematically shows the general structure of a data processing chain for an implementation of a channel decoding algorithm, FIG. 5 schematically shows the structure of a butterfly operator capable of being used by a portion of the data processing chain of FIG. 4, FIGS. 6A and 6B schematically show a possible implementation addition/subtraction modules of the butterfly operator of FIG. 5, FIGS. 7 and 8 schematically show the general structure of a butterfly operator according to two embodiments of the invention, and FIG. 9 schematically shows the general structure of a telecommunication device according to an embodiment of the invention.

The direct fast Fourier transform FFT is an algorithm for computing the discrete Fourier transform. This algorithm is used in digital signal processing to transform discrete data from the temporal or spatial domain to the frequency domain.

Take, for example, N discrete temporal values x[0], ..., x[N−1] of a signal x. The N frequency values of the discrete Fourier transform X of this signal x are defined by the following formula:

$$X[k] = \sum_{n=0}^{N-1} x[n] \cdot w^{kn},$$

for $k = 0, \ldots, N-1$, where $w = e^{-i\frac{2\pi}{N}}$.

As the inverse discrete Fourier transform is equivalent to the direct discrete Fourier transform, to the nearest sign and factor 1/N, the inverse fast Fourier transform IFFT uses the same algorithm as the FFT to compute this inverse discrete Fourier transform. Any processor for processing digital data configured for executing a direct fast Fourier transform FFT is therefore also capable of computing an inverse fast Fourier transform.

A particularly simple and widely used implementation of the FFT computation is the Radix-2 subdivision Cooley-Tukey algorithmic approach. It assumes that the number N of transformed samples is a power of 2 and recursively subdivides the processing of n samples into two identical processing loads of size n/2 at a lower scale. Indeed, at a first scale:

$$X[k] = $$

$$\sum_{n=0}^{N-1} x[n] \cdot e^{-i\frac{2\pi}{N}nk} = \sum_{n=0}^{N/2-1} x[2n] \cdot e^{-i\frac{2\pi}{N}2nk} + \sum_{n=0}^{N/2-1} x[2n+1] \cdot e^{-i\frac{2\pi}{N}(2n+1)k},$$

$$X[k] = \sum_{n=0}^{N/2-1} x[2n] \cdot e^{-i\frac{2\pi}{N/2}nk} + e^{-i\frac{2\pi}{N}k} \sum_{n=0}^{N/2-1} x[2n+1] \cdot e^{-i\frac{2\pi}{N/2}nk},$$

$$X[k] = \sum_{n=0}^{N/2-1} x[2n] \cdot e^{-i\frac{2\pi}{N/2}nk} + w^k \sum_{n=0}^{N/2-1} x[2n+1] \cdot e^{-i\frac{2\pi}{N/2}nk},$$

On a recurring basis, an FFT computation at a given scale is performed by two FFT computations at a lower scale, one for the even samples, the other for the uneven samples of the signal at the given scale.

By means of well-known additional simplifications, a trellis processing at a plurality of scales (or levels), involving the same number of successive steps, is thus obtained. A trellis example is shown in FIG. 1, with bit-reversed inputs for N=8 involving three steps St1, St2 and St3.

Each step comprises N/2 butterfly computations, for a total number of $N/2 \times \log_2(N)$ butterfly computations, as shown in FIG. 2. This butterfly computation requires cross computations of two data items $y_k[0]$ and $y_k[1]$, comprising a complex multiplication of one of the data items, $y_k[1]$, by a factor W in order to provide an intermediate value, then a complex addition and subtraction between $y_k[0]$ and this intermediate value to provide two data items $y_{k+1}[0]$ and $y_{k+1}[1]$. In the example shown in FIG. 1, the factor W is $w^0$ at scale/step St1, $w^0$ or $w^2$ at scale/step St2 and $w^0$, $w^1$, $w^2$ or $w^3$ at scale/step St3.

The two relationships linking $y_{k+1}[0]$ and $y_{k+1}[1]$ to $y_k[0]$ and $y_k[1]$ take the following form:

$$y_{k+1}[0]=y_k[0]+W \cdot y_k[1],$$

$$y_{k+1}[1]=y_k[0]-W \cdot y_k[1].$$

In practice, the butterfly computation is performed by an operator structured in a first complex multiplication stage and a second complex addition and subtraction stage receiving, at the input, the output data of the first stage. To perform its complex multiplication, the first stage comprises real multiplication hardware modules, real addition/subtraction hardware modules and data transmission links between these modules. To perform its complex addition and subtraction, the second stage comprises real addition/subtraction hardware modules and links for data transmission to these modules.

More specifically, noting:

$$y_k[1]=a+ib,$$

$$W=c+id,$$

$$y_k[0]=e+if,$$

wherein a, b, c, d, e and f are real values, the need is shown for real multiplication, addition and subtraction hardware modules:

$$y_{k+1}[0]=[e+(ac-bd)]+i[f+(bc+ad)],$$

$$y_{k+1}[1]=[e-(ac-bd)]+i[f-(bc+ad)].$$

In this simple form, the computation performed by a butterfly operator in principle requires four real multiplication hardware modules, three real addition hardware modules and three real subtraction hardware modules, as shown in the left-hand portion of FIG. 3.

More specifically, the first complex multiplication stage of the butterfly operator 10 shown in the left-hand portion of FIG. 3, with reference 12, comprises four multiplication modules 14, 16, 18 and 20 in order to produce the products ad, bc, bd and ac, respectively, an addition module 22 receiving the output data of modules 14 and 16 in order to produce the sum ad+bc and a subtraction module 24 receiving the output data of modules 18 and 20 to produce the subtraction ac−bd.

The second complex addition and subtraction stage of the butterfly operator 10, with reference 26, comprises:
   an addition module 28 receiving the output data from module 22 and variable f for performing the operation ad+bc+f, thus providing the imaginary part noted FFt-Im0 of $y_{k+1}+[0]$,
   and addition module 30 receiving the output data from module 24 and variable e for performing the operation ac−bd+e, thus providing the real part noted FFt-Re0 of $y_{k+1}[0]$,
   a subtraction module 32 receiving the output data from module 22 and variable f for performing the operation—ad−bc+f, thus providing the imaginary part noted FFt-Im1 de $y_{k+1}[1]$, and
   a subtraction module 34 receiving the output data from module 24 and variable e for performing the operation bd−ac+e, thus providing the real part noted FFt-Re1 de $y_{k+1}[1]$.

According to a more advantageous pipeline architecture, the same computation performed by a butterfly operator may require only two real multiplication hardware modules and four real addition and/or subtraction modules, but then uses, in addition, two multiplexers, as shown in the right-hand portion of FIG. 3. This architecture takes advantage of the fact that the real multiplications ac and bc, on the one hand, and ad and bd, on the other hand, may be performed in two successive clock cycles.

More specifically, the first complex multiplication stage 12' of the butterfly operator 10' shown in the right-hand portion of FIG. 3 comprises, first of all, at a first sequential level:
three registers R1, R2 and R3, respectively and successively receiving the operands c and d for register R1, the operands b and f for register R2 (wherein the operand f is not exploited and systematically erased by the next operand b) and the operands a and e for the register R3 (wherein the operand e is not exploited and systematically erased by the next operand a),
a multiplication module 36 supplied by the registers R1 and R2 in order to successively perform, in two clock cycles, the operations bc and bd, and
a multiplication module 38 supplied by the registers R1 and R3 in order to successively perform, in two clock cycles, the operations ac and ad.

It then comprises at a second sequential level:
two registers R4 and R5, respectively receiving the outputs of the multiplication modules 36 and 38,
an addition module 40 receiving the output of register R4 and that of the multiplication module 38 in order to perform the operation ac−bd, and
a subtraction module 42 receiving the output of the register R5 and that of the multiplication module 36 in order to perform the operation bc+ad.

The second complex addition and subtraction stage 26' of the butterfly operator 10' comprises:
two registers R6 and R7, respectively receiving the outputs of the addition 40 and subtraction 42 modules,
two registers R8 and R9, each successively receiving the operands b and f, wherein operand b is not exploited and systematically erased by the next operand f, these two registers enabling the temporary storage of two successive values of operand f while the computations in two clock cycles of the first complex multiplication stage 10' are executed,
a multiplexer 44 with two inputs and an output, linked to the two registers R8 and R9, switching with each clock cycle from one register to the other in order to select, each time, the first of the two values of f temporarily stored,
two registers R10 and R11, each successively receiving the operands a and e, wherein the operand a is not exploited and systematically erased by the next operand e, these two registers enabling the temporary storage of two successive values of e while the computations in two clock cycles of the first complex multiplication stage 10' are executed,
a multiplexer 46 with two inputs and an output, linked to the two registers R10 and R11, switching with each clock cycle from one register to the other in order to select, each time, the first of the two values of e temporarily stored,
an addition/subtraction module 48, switching with each clock cycle from adder to subtractor or the reverse, receiving the outputs of register R6 and of the multiplexer 44 in order to successively perform the operations f+(bc+ad) and f−(bc+ad), thus successively providing the imaginary part noted FFt-Im0 of $y_{k+1}[0]$ and the imaginary part noted FFt-Im1 of $y_{k+1}[1]$, and an addition/subtraction module 50, switching with each clock cycle from adder to subtractor or the reverse, receiving the outputs of register R7 and of the multiplexer 46 in order to successively perform the operations e+(ac−bd) and e−(ac−bd), thus successively providing the real part noted FFt-Re0 of $y_{k+1}[0]$ and the real part noted FFt-Re1 of $y_{k+1}[1]$.

It therefore clearly appears that the two butterfly operator structures 10 and 10' shown in FIG. 3 are equivalent in terms of computation performed in order to perform an FFT computation. However, the pipeline structure 10' has better optimization of the surface used and a lower consumption than structure 10.

The general structure of a data processing chain for an implementation of a channel decoding algorithm, for example the Viterbi algorithm, is shown in FIG. 4.

This algorithm is intended to find, by recurrence, the most likely sequence of states having produced a sequence measured $[X_0, \ldots, X_{N-1}]$ in the case of a signal encoded by a convolutional encoder, i.e. an encoder comprising a shift register wherein each incoming bit generates a shift in the register and an output result.

Its principle is to compare each value received with all of the possible outputs of the shift register so as to determine the most likely shift of this register that produced the value received. The knowledge of this shift makes it possible to know the value that caused it and therefore the value generating the message received.

For each message value received, a trellis structure is obtained that transfers all possible states of the shift register on y coordinates and all possible transitions on x coordinates, with the trellis pattern invariably repeating over time at each new encoder input. At the encoder output, only certain binary sequences are possible. They correspond to the different paths that exist in the trellis diagram.

The application of a channel decoding algorithm, and in particular the Viterbi algorithm, then consists of searching, in the trellis, for the binary sequence closest to the sequence received. In practice, the algorithm procedure comprises the following three operations, at each instant and for each trellis state:
a computation of branch metric values performed by a unit 52, consisting of computing, upon receiving N symbols (for a yield of 1/N), values representing the likelihood of the symbols received with respect to the $2^N$ possible symbols. These $2^N$ values are called branch metrics and noted Bm00, Bm01, Bm10 and Bm11 for N=2;
a computation of path metric and survivor values performed by a unit 54, consisting of determining the most likely state of the shift register. For each node of the trellis, a path metric representing the cumulative probability for this node to be part of the transmitted sequence is updated, taking into account the path metric computed in the previous cycle and values of current branch metrics. This update comprises the computation of two path metrics and the selection of the lowest (survivor path);
storage of the decision bit performed by a unit 56, in order to restore the decoded signal at the end of frame by a survivor recovery technique.

Specifically, the unit 52 computes the difference between the value received and the possible values of the shift register. It is generally qualified as a BMC (Branch Metric Computation) unit.

The unit 54, generally qualified as an ACS (Add, Compare, Select) unit, performs, at each node of the trellis, additions of two path metrics with the branch metrics, a comparison of the two path metrics obtained and a selection of the lowest.

For a computation based on four branch metrics Bm00, Bm01, Bm10 and Bm11 computed by the BMC 52 unit, it is thus possible to bring up a butterfly operator as shown in FIG. 5, for the computation of the following two path metrics:

$$Pm_k[t+1]=Vit0=\text{Min}(Pm_k[t]+Bm00, Pm_{k+1}[t]+Bm10),$$

$$Pm_{k+N/2}[t+1]=Vit1=\text{Min}(Pm_k[t]+Bm01, Pm_{k+1}[t]+Bm11)$$

Independently of the above equation, when the four branch metrics Bm00, Bm01, Bm10 and Bm11 result from a pair (x, y) of possible input values, they can, for example, be computed as follows:

$$\begin{cases} Bm00 = x+y \\ Bm01 = x-y \\ Bm10 = -x-y \\ Bm11 = -x+y. \end{cases}$$

When it is considered that the detection of a minimum by comparison of two values can be performed by means of a subtractor coupled to a multiplier, it is noted that this butterfly operator requires, in order to perform the computations of the BMC 52 and ACS 54 units, namely a computation of branch metric values and path metric and survivor values of an implementation of a channel decoding algorithm:

for each of the two path metric and survivor computations, two addition hardware modules and one subtraction hardware module (ACS unit 54), four addition or subtraction hardware modules for the computation of the four branch metric values Bm00, Bm01, Bm10 and Bm11 (BMC unit 52).

As shown in FIG. 6A, if the pair of possible input values is noted (x, y), then the BMC unit 52 of the butterfly operator of FIG. 5 comprises, at a first sequential level:

an addition module 60 for performing the operation x+y=Bm00, and a subtraction module 62 for performing the operation x−y=Bm01, and at a second sequential level:

a subtraction module 64 receiving, at the input, the output of module 60 to be subtracted from the value "0" in order to perform the operation 0−(x+y)=Bm10, and a subtraction module 66 receiving, at the input, the output of module 62 to be subtracted from the value "0" in order to perform the operation 0−(x−y)=Bm11.

As shown in FIG. 6B, if P0 and P1 are noted as the two path metrics computed in the previous cycle, then the ACS unit 54 of the butterfly operator of FIG. 5 comprises, at a first sequential level:

an addition module 68 receiving the branch metric Bm00 or Bm01 and the variable P0 in order to perform the operation P0+Bm00 or P0+Bm01, and an addition module 70 receiving the branch metric Bm10 or Bm11 and the variable P1 in order to perform the operation P1+Bm10 or P1+Bm11, and at a second sequential level:

a subtraction module 72 receiving the output data from modules 68 and 70 for a comparison of P0+Bm00 and P1+Bm10 making it possible to deduce the value of Vit0 therefrom, or for a comparison of P0+Bm01 and P1+Bm11 making it possible to deduce the value of Vit1 therefrom.

It then appears that the butterfly and pipeline structure of the FFT butterfly operator 10', on the one hand, and the butterfly structure of the channel decoding operator of FIG. 5, on the other hand, involve hardware configurations making it possible to envisage sharing a portion of their addition/subtraction hardware modules and links between these modules within the same architecture, by means of parameterization of at least one element, module and/or link, of this architecture by means of at least one multiplexer, for example.

In particular, the set E constituted by the second sequential level of the first complex multiplication stage 12' and the second complex addition and subtraction stage 26' of the butterfly operator 10' has four addition and/or subtraction hardware modules just like the set constituted by the first and second sequential levels of the BMC unit 52. This set E can therefore be used by means of parameterization, either in an FFT computation configuration or in a branch metric computation configuration of a channel decoding algorithm, such as, for example, the Viterbi algorithm, but also a "Turbo decoder"- or BCJR-type algorithm.

Also in particular, the set constituted by the first and second sequential levels of the ACS unit 54 has three addition and/or subtraction hardware modules. This set can therefore take advantage of the hardware modules of set E. Set E can therefore be used by means of parameterization as well, either in the FFT computation configuration or in the path metric and survivor computation configuration of a channel decoding algorithm, such as, for example, the Viterbi algorithm, but also a "Turbo decoder"- or BCJR-type algorithm.

In conclusion, the pipeline architecture of the butterfly operator 10' may be modified very simply in order to be capable of being used by means of parameterization, either in the FFT computation configuration or in the branch metric computation configuration of a channel decoding algorithm, or in the path metric and survivor computation configuration of a channel decoding algorithm.

Thus, for example, the data processing processor 80 schematically shown in FIG. 7 is obtained. This processor 80 comprises at least one butterfly operator 82 that is almost identical to that of the right-hand portion of FIG. 3 (operator 10'). This butterfly operator 82 with a pipeline architecture comprises the same elements R1 to R11 and 36 to 50 as the butterfly operator 10'. They will not therefore be described again.

However, it differs from the butterfly operator 10' in that it also comprises an additional multiplexer 84 with two inputs and an output interposed between the output of the multiplexer 44 and the input of the addition/subtraction module 48 to which the multiplexer 44 is linked in the butterfly operator architecture 10'. One of the two inputs of the additional multiplexer 84 thus receives the output of the multiplexer 44 and its other input is linked to the output of the addition module 40.

In addition, four butterfly operator outputs 82 are in particular observed: the output S1 of the addition module 40, the output S2 of the addition/subtraction module 48, the output S3 of the addition/subtraction module 50 and the output S4 of the addition module 42.

Finally, certain elements of the data processing processor 80 are configurable by means of at least one programmable parameter so that the butterfly operator 82 can be used in the FFT computation configuration, or in the branch metric computation configuration of a channel decoding algorithm, or in the path metric or survivor computation configuration of a channel decoding algorithm. These configurable elements are represented in grey. This is the multiplexer 84 and the addition/subtraction modules 48 and 50.

According to a first FFT configuration, a set A of parameters is provided at the input of the registers R1, R2, R3 of the processor 80, the multiplexer 84 is configured so as to provide the output of the multiplexer 44 at the input of the addition/subtraction module 48 and the two addition/subtraction modules 48 and 50 are configured so as to switch from adder to subtractor and the reverse with each clock cycle. The set A of parameters contains the same parameters as those provided to the operator 10', namely, successively, c, d for register R1, b, f for register R2 and a, e for register R3. This first configuration makes it possible to find exactly the architecture and the configuration of the operator 10', resulting in an operation of the processor 80 in the FFT computation configuration. The outputs observed in this first configuration are S2 (for the successive results FFt-Im0 and FFt-Im1) and S3 (for the successive results FFt-Re0 and FFt-Re1). It is noted that in this first configuration, all of the resources of the processor 80 are actually used.

According to a second BMC configuration, a set B of parameters is provided at the input of the registers R1, R2, R3 of the processor 80, the multiplexer 84 is configured so as to provide the output of the multiplexer 44 at the input of the addition/subtraction module 48 and the two addition/subtraction modules 48 and 50 are configured as subtractors. The set B of parameters provided to the processor 80 contains the neutral element "1" of the multiplication for register R1, the successive values x, "0" for register R2 and "0", y for register R3. This second configuration makes it possible to remove the multiplications of modules 36 and 38 owing to the value "1" provided to register R1 and obtain the results x+y and x−y at the outputs of modules 40 and 42. By proper synchronization of the multiplexers 44 and 46, it also makes it possible to provide the value "0" to the subtraction modules 48 and 50 so that the latter provide the results −x−y and −x+y. The outputs observed in this second configuration are S1 (for the result x+y=Bm00), S2 (for the result −x−y=Bm10), S3 (for the result −x+y=Bm11), and S4 (for the result x−y=Bm01).

According to a third ACS configuration, a set C of parameters is provided at the input of the registers R1, R2, R3 of the processor 80, the multiplexer 84 is configured so as to provide the output of the addition module 40 at the input of the addition/subtraction module 48 and the addition/subtraction module 48 is configured as a subtractor.

The set C of parameters provided to the processor 80 contains:
the neutral element "1" of the multiplication for register R1, the successive values P0, Bm10 for register R2 and P1, Bm00 for register R3 (set C1), or
the neutral element "1" of the multiplication for register R1, the successive values P0, Bm11 for register R2 and P1, Bm01 for register R3 (set C2).

This third configuration makes it possible to remove the multiplications of modules 36 and 38 owing to the value "1" provided to register R1 and successively obtain the results P0+Bm00 and P1+Bm10 (when the set C1 is provided at the input) or P0+Bm01 and P1+Bm11 (when the set C2 is provided at the input) at the output of the addition module 40. The successive results provided by the module 40 are then subtracted from one another by the module 48 configured as a subtractor, owing to the multiplexer 84 and the shift caused by the register R6. The outputs observed in this second configuration are S1 (for the successive results P0+Bm00 and P1+Bm10 when C1 is provided at the input, for the successive results P0+Bm01 and P1+Bm11 when C2 is provided at the input) and S2 (for the result P0+Bm00−(P1+Bm10) when C1 is provided at the input, for the result P0+Bm01−(P1+Bm11) when C2 is provided at the input).

Alternatively, the data processing processor 80 can in an entirely equivalent manner, be designed as shown in FIG. 8.

In this alternative embodiment, an additional multiplexer is not added 84. The multiplexer 44 with two inputs and an output of the operator 10' is simply replaced by a multiplexer 84' with three inputs and an output configurable so as to operate strictly as a set of the two multiplexers 44 and 84 as assembled one (multiplexer 44) upstream of the other. Thus, the three inputs of the multiplexer 84' are linked to the outputs of the registers R8 and R9 and of the addition module 40. The output of the multiplexer 84' is linked to one of the inputs of the subtraction/addition module 48.

It clearly appears that the data processing processor 80 described above can be configured by means of at least one parameter in order to perform an FFT computation in a first configuration, a branch metric computation of an implementation of a channel decoding algorithm in a second configuration and a path metric and survivor computation of an implementation of a channel decoding algorithm in a third configuration. The switching from one configuration to another is very simple in the examples detailed above, by a simple parameterization of the addition/subtraction modules 48, 50 and possible links between the module 48 and the elements 40, 46.

Although the FFT and channel decoding algorithms are different both in the data that they process and in the functions that they perform, the sharing of subtraction and/or addition hardware modules and the design of a common structure are made possible owing to the original demonstration of a similarity in the operation of the butterfly operators that they implement.

With respect to a data processing processor with a butterfly operator capable only of performing an FFT computation and having a pipeline architecture with two multipliers, it requires just the addition or the replacement of a multiplexer. Thus, by comparing an FFT computation operator to an operator computing branch metric values and path metric and survivor values of an implementation of a channel decoding algorithm with the operator described above, the need for addition and/or subtraction operators is very significantly reduced.

The gain is even greater insofar as the FFT and channel decoding computations are generally not performed simultaneously. In addition, separating the branch metric computations and the path metric and survivor computations of a channel decoding algorithm makes it possible to avoid unnecessary duplication of hardware resources.

Moreover, the overall resources necessary for the FFT computations, on the one hand, and for the channel decoding computations, on the other hand, are different (with reference to the current standards, the size of the FFTs oscillates between 64 and 2048, requiring between 32 and 1024 butterfly operators per step of the trellis, even though the degrees of the polynomials generating convolutional codes vary between 4 and 8, requiring between 8 and 128 butterflies), and the overall resources necessary for the branch metric computations, on the one hand, and the path metric and survivor computations, on the other hand, also being different, then the ability to parameterize the three configurations mentioned above makes it possible to truly optimize the size and use of a microprocessor implementing a plurality of such reconfigurable butterfly operators. In the end, a better distribution of resources according to the standard target requirements is ensured. More specifically, the resources to be allocated for the FFT computations are generally much greater than those necessary for the processing of a channel decoding algorithm and in particular the Viterbi algorithm, so that a parallelization of the channel decoding algorithms enabling them to be accelerated is made possible without additional costs in terms of reconfigurable operators.

Another advantage of this common structure is that it makes it possible to take advantage, in the channel decoding mode, of the fact that the data processed in the FFT mode must be capable of being complex and their real and imaginary parts are generally integers. In the channel decoding mode, the processing processor is then capable of operating both with hard input data (binary) and soft input data (integers).

Finally, in consideration of the variability in the performance of microelectronic technologies, it is advantageous to propose the most regular possible basic processors. Indeed, it is thus possible to envisage implanting such processors in excess in a redundant architecture and configuring them a posteriori according to the performance or any failures of each of these processors.

Consequently, a data processing processor 80 as described above is advantageously integrated in a telecommunication device 86 with multicarrier modulation/demodulation of the transmitted/received signals and with decoding of signals processed by a convolutional code as shown in FIG. 9. It is noted that the processor 80 may comprise a plurality of reconfigurable butterfly operators $82_1, \ldots, 82_n$ such as the operator 82 described above.

The device 86 shown in FIG. 9 is more specifically a telecommunication terminal, but the invention may of course be implemented in other types of telecommunication devices such as a base station of a telecommunication network, a modem, a wireless decoder or CPE-type (Customer Premises Equipment) telecommunication equipment.

This processor with two modes of channel decoding and FFT operation has multiple applications, whether for a single-standard device or for a multi-standard device. Indeed, many standards implement, for example, an OFDM modulation (FFT computation) and require convolutional code channel decoding (for example the Viterbi algorithm), including:

DAB terrestrial digital radio broadcasting,
terrestrial digital television broadcasting (DVB-T, DVB-H),
T-DMB terrestrial digital radio broadcasting,
DRM digital radio broadcasting,
wire connections: ADSL, VDSL, power line modem (Homeplug), cable modem (DOCSIS standard),
wireless networks based on standards 802.11a, 802.11g (Wi-Fi), 802.16 (WiMAX) and HiperLAN,
new-generation mobile networks (4G).

This list is of course incomplete since almost all current standards or standards being studied use an OFDM modulation and/or convolutional code channel decoding.

In addition, recent work has shown that FFT could be applied to operations more diversified than a simple modulation. In particular, it can be used for correlation computations, FIR-type filter genesis, channel estimation or the detection of a plurality of users. In addition, it has been shown that the Radix-2 structure can easily be used as a basic structure in order to produce other types of Radix. Similarly, the Viterbi algorithm in previous studies was applied to the decoding of Turbo Codes.

Thus, the common FFT/channel decoding architecture proposed can be used by most of the functions of telecommunication devices and is not limited to channel decoding and modulation/demodulation units alone.

It will finally be noted that the invention is not limited to the embodiments envisaged. It will indeed appear to a person skilled in the art that various modifications may be made to the embodiment described above, in light of the teaching just disclosed. In the claims below, the terms used should not be interpreted as limiting the claims to the embodiment disclosed in the present description, but should be interpreted as including all equivalents that the claims are intended to cover by their wording and which can be envisaged by a person skilled in the art applying his or her general knowledge to the embodiment of the teaching just disclosed.

The invention claimed is:

1. A processor for processing digital data comprising:
at least one butterfly operator for execution of a fast Fourier transform computation, the butterfly operator having a pipeline architecture for synchronized receiving and processing of input data according to a clock signal, the pipeline architecture comprising a plurality of elements including addition, subtraction, and multiplication hardware modules and links for synchronized transmission of data between the modules, the butterfly operator comprising first and second stages forming a complex multiplication module with a pipeline architecture, and a third stage comprising two addition/subtraction hardware modules receiving outputs of the hardware modules of the second stage;

wherein:
the butterfly operator comprises a multiplexer assembly including a plurality of inputs and an output, one of the inputs of the multiplexer assembly receiving an output of an addition hardware module of the second stage and an output of the multiplexer assembly being linked to one of inputs of one of the addition/subtraction modules of the third stage receiving an output of the addition hardware module; and the multiplexer assembly and the two addition/subtraction hardware modules are configurable by at least one programmable parameter, between a first configuration wherein the butterfly operator performs said fast Fourier transform computation and a second configuration wherein the butterfly operator performs a metric computation of an implementation of a channel decoding algorithm.

2. A processor for processing digital data according to claim 1, wherein:
the first stage is a multiplication stage comprising two real multiplication hardware modules;
the second stage is an addition and subtraction stage comprising an addition hardware module and a subtraction hardware module; and
the butterfly operator has four outputs that can be observed, respectively linked to the outputs of the addition hardware module and the subtraction hardware module of the second stage and to the outputs of the two addition/subtraction hardware modules of the third stage.

3. A processor for processing digital data according to claim 1, wherein the multiplexer assembly and the two addition/subtraction hardware modules are configurable by the programmable parameter between the first configuration wherein the butterfly operator performs the fast Fourier transform computation, a second configuration wherein the butterfly operator performs a computation of branch metric values of an implementation of a channel decoding algorithm, and a third configuration wherein the butterfly operator performs a path metric and survivor value computation of an implementation of a channel decoding algorithm.

4. A processor for processing digital data according to claim 1, wherein the multiplexer assembly with a plurality of inputs and an output has selection of one of its inputs by at least the programmable parameter.

5. A processor for processing digital data according to claim 4, wherein the multiplexer assembly with a plurality of inputs and an output comprises two multiplexers with two inputs and an output, an output of one of the two multiplexers, as an upstream multiplexer, being linked to one of inputs of the other of the multiplexers, as a downstream multiplexer, for supply of a multiplexer assembly with three inputs and an output, and wherein the downstream multiplexer has selection of one of its two inputs by the programmable parameter.

6. A processor for processing digital data according to claim 1, wherein the two addition/subtraction hardware modules are configurable by the programmable parameter between the first configuration wherein they switch from adder to subtractor and the reverse with each clock cycle and the second configuration wherein they operate only as a subtractor.

7. A processor for processing digital data according to claim 1, comprising a plurality of butterfly operators configurable between the first configuration and the second configuration, wherein the butterfly operators are structured with respect to one another for a fast Fourier transform computation by a Radix-2 trellis Cooley-Tukey algorithmic approach and for an implementation of a trellis channel decoding algorithm with four reference symbols.

8. A telecommunication device with multicarrier modulation/demodulation of transmitted/received signals and with decoding of processed signals by a convolutional code, comprising at least one processor for processing digital data according to claim 1.

9. A telecommunication device according to claim 8, with OFDM modulation and demodulation.

10. A telecommunication device according to claim 9, of multi-standard type, comprising at least one modulator/demodulator with OFDM modulation and demodulation compatible with each standard implemented and at least one decoder of signal encoded by a convolutional code compatible with each standard implemented.

* * * * *